United States Patent [19]
Ma et al.

[11] Patent Number: 6,074,933
[45] Date of Patent: Jun. 13, 2000

[54] INTEGRATED CIRCUIT FABRICATION

[75] Inventors: Yi Ma; Pradip Kumar Roy, both of Orlando, Fla.

[73] Assignee: Lucent Technologies Inc., Murray Hill, N.J.

[21] Appl. No.: 08/924,730

[22] Filed: Sep. 5, 1997

[51] Int. Cl.⁷ .................................................. H01L 21/76
[52] U.S. Cl. ........................ 438/443; 438/449; 438/450; 438/452
[58] Field of Search ....................... 438/217, 443, 438/452, 459, 449, 450

[56] References Cited

U.S. PATENT DOCUMENTS

| 5,599,730 | 2/1997 | Lee et al. | 437/69 |
| 5,607,543 | 3/1997 | Eisenberg et al. | 156/662.1 |
| 5,650,350 | 7/1997 | Dennison et al. | 438/217 |

*Primary Examiner*—Trung Dang
*Attorney, Agent, or Firm*—John T. Rehberg; William S. Francos

[57] ABSTRACT

Undesirable birds beak pull back due to ion implant damage is alleviated by additional oxide growth.

8 Claims, 2 Drawing Sheets

100% 6,074,933

INTEGRATED CIRCUIT FABRICATION

TECHNICAL FIELD

This invention relates to integrated circuits and methods for their fabrication.

BACKGROUND OF THE INVENTION

Typical submicron integrated circuit fabrication processes include, for example, the definition of isolation oxides, sometimes called field oxides 13 (FIG. 1) upon a substrate 11. The field oxides 13 define a comparatively flat region 15 of the substrate which is often termed "moat". In the initial stages of, illustratively, CMOS fabrication, the moat is covered with a sacrificial grown oxide 17.

After formation of the field oxide 13 and sacrificial oxide 17, one or more ion implantation steps is performed, for example, to define either a p-tub or an n-tub, or to adjust the threshold voltage of the subsequently formed transistors. Illustrative implantation species are: arsenic, phosphorus, boron, or boron fluoride. Some of the implanted species are denoted by reference numeral 19.

The ion implantation step tends to change the stoichiometry of the upper portions of field oxide 13, thereby making the upper portion of field oxide 13 susceptible to being etched more quickly in a wet etch solution than oxides which have not been influenced or damaged by ion implantation.

After dopant species 19 has been implanted into substrate 11, a wet etch (illustratively using HF) is performed to remove sacrificial oxide 17 (so that a gate oxide may be subsequently grown). The wet etch attacks upper surface 21 of field oxide 13, thereby etching the upper surface of field oxide downward to a location approximately indicated by reference line 23.

The accelerated etching of field oxide 13 described above is sometimes called "birds beak pull back". Such "birds beak pull back" undesirably reduces the vertical height of field oxide 13. Such height reduction is particularly undesirable for submicron devices which utilize comparatively thin field oxides. Such thinning of the field oxide adversely affects the effectiveness of the field oxide in inhibiting parasitic transistor action. Furthermore, the birds beak pull back exposes a portion of the substrate which has a different dopant concentration than the majority of the moat area. The above-mentioned problems adversely affect device yield.

Those concerned with the development of integrated circuit technology have sought more reliable methods of device fabrication.

SUMMARY OF THE INVENTION

Illustratively, the present invention includes the formation of a field oxide defining moats within a substrate; directing a dopant species at the substrate nd removal of damage to the upper surface of the field oxide.

DETAILED DESCRIPTION

Figure 2:
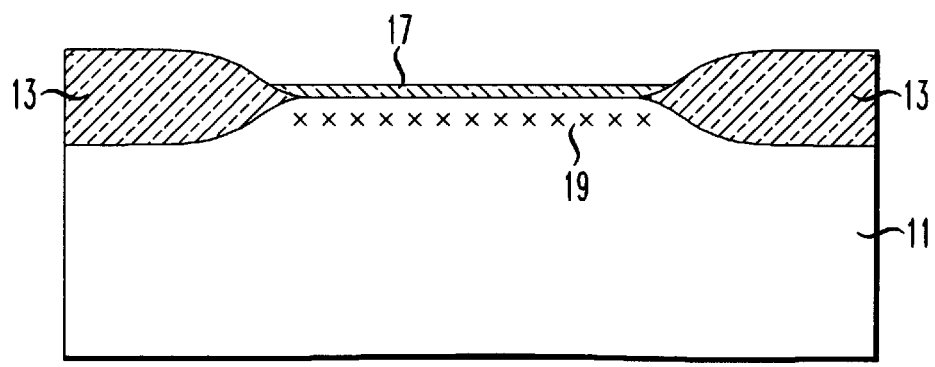

Several illustrative embodiments of the invention will be described. In a first embodiment, referring to FIG. 2, reference numeral 11 denotes a substrate which may, illustratively, be silicon, epitaxial silicon, or doped silicon. Reference numeral 13 denotes a field oxide or other isolation oxide which may be formed by a variety of methods known to those skilled in the art, including the popular LOCOS ("local oxidation of silicon" or poly-buffered LOCOS process) process. Reference numeral 17 denotes a grown oxide, often termed "a sacrificial oxide". Illustratively, the thickness of oxide 17 may be 100 Å±25 Å. One or more ion implantation steps are performed, illustratively, employing dopants such as: arsenic, boron, phosphorus, or boron fluoride. Some of the implanted dopant species are denoted by reference numeral 19. Other species implanted to possibly greater depth are not shown for reasons of clarity. Illustratively, the ion implantation step may be performed to define an n-tub or a p-tub, or the ion implantation step may be performed to adjust the threshold voltage of the yet-to-be-formed transistors.

Figure 3:
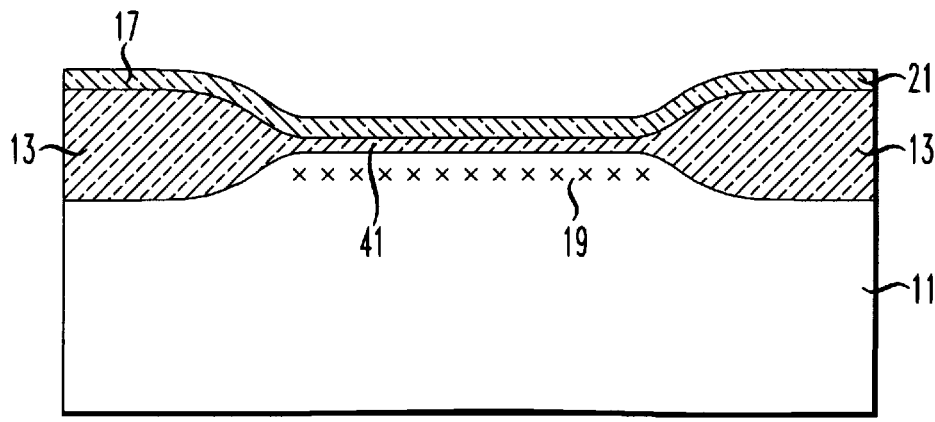

Turning to FIG. 3, an additional oxide layer 41 is next grown. Layer 41 grows under sacrificial oxide 17 and slightly increases the height of field oxide 13 (now indicated by reference numeral 17).

Illustratively, layer 41 may be grown in oxygen or steam at a temperature of 900° C.±100° C. Layer 41 may illustratively have a thickness of approximately 50 Å±25 Å. It has been found that the oxide growth process tends to restore the stoichiometry of the upper portion 21 of oxide 13. Consequently, the increased etch rate previously described with regard to upper surface 21 is substantially reduced.

Figure 4:
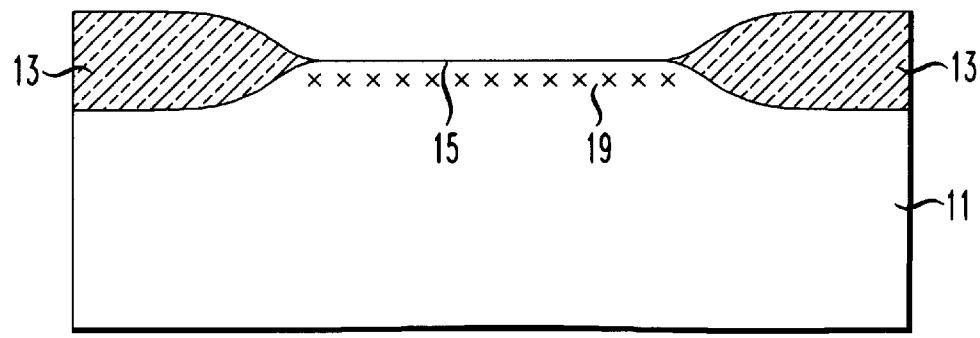

Turning to FIG. 4, layers 41 and 17 are removed, illustratively by a wet etch process utilizing a HF. The birds beak pull back problem mentioned previously is alleviated because the damage done to field oxide 13 by ion implantation has been reduced. Subsequent processing may include the formation, for example, gates in moat 15, definition of source and drain regions, dielectric deposition, window opening, contact metallization, etc.

Figure 1:
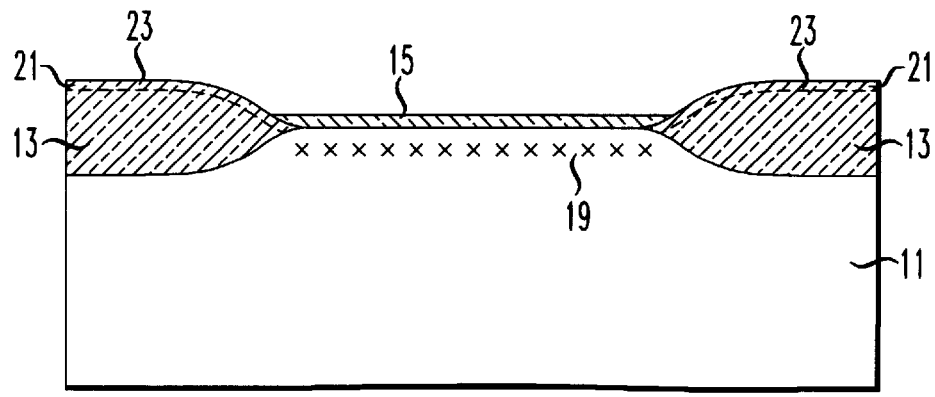
FIGS. 1–6 are cross sectional views of a partially-fabricated integrated circuit useful in understanding several illustrative embodiments of the invention.

Another embodiment may be understood by first referring to FIG. 1, wherein, as mentioned before, field oxide 13 is formed upon substrate 11. Sacrificial oxide 17 is formed above moat area 15. Ion implantation 19, as mentioned before, as been performed.

Figure 5:
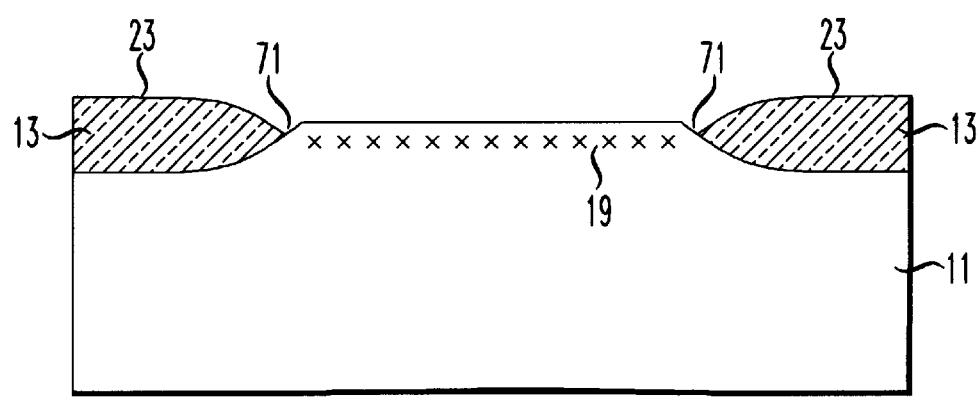

Next, a wet etch is performed to remove sacrificial oxide 17. Undesirable birds beak pull back is observed. Upper surface 21 of field oxide 13 is etched back to approximately reference line 23. The structure depicted in FIG. 5 is obtained. Portions 71 of substrate 11 are undesirably exposed by the birds beak pull back phenomenon.

Figure 6:
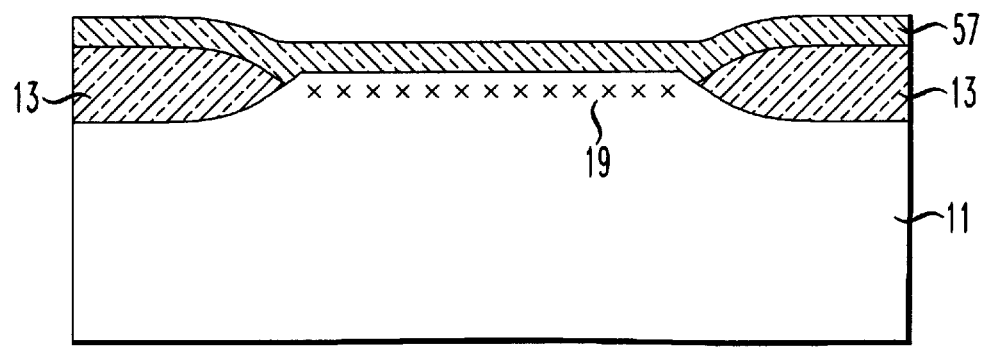

Turning to FIG. 6, an oxide growth step is performed. Illustratively, the oxide may be formed by growing an oxygen or steam at a temperature between 800° C. and 900° C. until the thickness of approximately 150 Å is achieved.

Next, the structure of FIG. 6 is subjected to a wet etch, thereby, producing a structure similar to the structure of FIG. 4. Comparison of FIGS. 5, 6, and 4 shows that the growth of oxide 51 has remedied the undesirable birds beak pull back and facilitated the creation of a field oxide 13 having acceptable vertical height without exposure of portion 71 of substrate 11.

The invention claimed is:

1. A method of integrated circuit fabrication comprising:

forming a field oxide to thereby define moats upon a substrate:

forming a first layer upon said moat;

performing an ion implantation through said first layer;

forming a second layer under said first layer and over said field oxide; and removing said first and second layers.

2. A method of integrated circuit fabrication, comprising:

forming a field oxide to define moats upon a substrate; said field oxide having at least one birds beak;

forming a first layer upon said moat;

performing an ion implantation step through said first layer;

forming a second layer upon said moat and said field oxide; and removing said first and second layers, wherein said second layer prevents birds beak pull back during said removing of said first and said second layers.

3. A method as recited in claim 2, wherein said second layer is a grown oxide.

4. A method of integrated circuit fabrication, comprising:

forming a field oxide to thereby define moats upon a substrate;

forming a first layer upon said moat;

performing an ion implantation through said first layer;

forming a second layer upon said moat and said field oxide; and removing said first and second layer, wherein said first and said second layers are removed in same step.

5. A method as recited in claim 4, wherein said second layer removes damage to an upper surface of said field oxide.

6. A method as recited in claim 4, wherein said second layer prevents birds beak pull back of said field oxide during said removing of said first and second layers.

7. A method of integrated circuit fabrication comprising:

forming a field oxide within a substrate, said field oxide having an upper surface and said field oxide defining moats upon said substrate;

directing a dopant species at said substrate, said dopant species penetrating and damaging said upper surface of said field oxide; and removing said damage to said upper surface of said field oxide by disposing a layer of oxide on said upper surface of said field oxide.

8. A method of integrated circuit fabrication comprising:

forming a field oxide within a substrate, said field oxide having an upper surface and said field oxide defining moats upon said substrate;

forming a first layer upon said moats and forming a second layer under said first layer and on said field oxide;

directing a dopant species at said substrate, said dopant species penetrating and damaging said upper surface of said field oxide; and removing said damage to said upper surface of said field oxide.

* * * * *